(12) United States Patent
Alessi et al.

(10) Patent No.: US 11,778,358 B2
(45) Date of Patent: Oct. 3, 2023

(54) DEVICE AND METHOD FOR DETECTING A CHANGE IN OPERATING ENVIRONMENT FOR AN ELECTRONIC APPARATUS

(71) Applicant: STMicroelectronics S.r.l., Agrate Brianza (IT)

(72) Inventors: Enrico Rosario Alessi, Catania (IT); Fabio Passaniti, Syracuse (IT); Tiziano Chiarillo, Mascalucia (IT); Massimiliano Pesaturo, Torre de' Roveri (IT)

(73) Assignee: STMicroelectronics S.r.l., Agrate Brianza (IT)

(*) Notice: Subject to any disclaimer, the term of this patent is extended or adjusted under 35 U.S.C. 154(b) by 97 days.

(21) Appl. No.: 17/567,777

(22) Filed: Jan. 3, 2022

(65) Prior Publication Data

US 2022/0225003 A1 Jul. 14, 2022

(30) Foreign Application Priority Data

Jan. 8, 2021 (IT) .......................... 102021000000293

(51) Int. Cl.
*H04R 25/00* (2006.01)
*H04R 1/10* (2006.01)
*G01R 29/12* (2006.01)
*H04R 29/00* (2006.01)

(52) U.S. Cl.
CPC .......... *H04R 1/1016* (2013.01); *G01R 29/12* (2013.01); *H04R 1/1041* (2013.01); *H04R 29/00* (2013.01); *H04R 2420/07* (2013.01); *H04R 2460/15* (2013.01)

(58) Field of Classification Search
CPC .... H04R 1/1016; H04R 1/1041; H04R 29/00; G01R 29/12
See application file for complete search history.

(56) References Cited

U.S. PATENT DOCUMENTS

| | | | |
|---|---|---|---|
| 10,491,981 B1 | 11/2019 | Wang et al. | |
| 2014/0226836 A1* | 8/2014 | Miyatake | H04R 1/1083 381/94.1 |
| 2014/0232516 A1 | 8/2014 | Stivoric et al. | |

(Continued)

FOREIGN PATENT DOCUMENTS

| | | |
|---|---|---|
| CN | 111770407 A | 10/2020 |
| EP | 2980609 A1 | 2/2016 |
| KR | 20110061750 A | 6/2011 |

*Primary Examiner* — Simon King
(74) *Attorney, Agent, or Firm* — SEED INTELLECTUAL PROPERTY LAW GROUP LLP

(57) ABSTRACT

A detection device includes a pressure sensor, which provides a pressure signal indicative of an ambient pressure in an operating environment. An electrostatic-charge-variation sensor provides a charge-variation signal indicative of a variation of electrostatic charge associated with the operating environment, and processing circuitry is coupled to the pressure sensor and to the electrostatic-charge-variation sensor so as to receive the pressure signal and the charge-variation signal, and jointly processes the pressure signal and the charge-variation signal for detecting a variation between a first operating environment and a second operating environment for the detection device. The second operating environment is different from the first operating environment.

22 Claims, 7 Drawing Sheets

(56) References Cited

U.S. PATENT DOCUMENTS

2016/0342781 A1    11/2016  Jeon
2017/0067929 A1*   3/2017   Wiseman ............ G01P 13/0066
2018/0081536 A1*   3/2018   Ueno .................... G06F 3/0346

* cited by examiner

DEVICE AND METHOD FOR DETECTING A CHANGE IN OPERATING ENVIRONMENT FOR AN ELECTRONIC APPARATUS

BACKGROUND

Technical Field

The present disclosure relates to a device and a method for detecting a change in operating environment for an electronic apparatus, in particular of a wearable type.

Description of the Related Art

As it is known, there are several electronic devices, particularly of a wearable type, in which detection of a change in operating environment is required in order to modify operating parameters and/or activate/deactivate functions of the same devices.

For instance, known wearable electronic devices for audio applications (so-called "hearables") implement an automatic detection of insertion into the auditory canal (i.e., of the change in operating environment from the external environment, air, to the internal environment inside the ear) in order to activate automatically some specific functions, such as, for example, listening to music or answering a voice call in the case of earpieces associated with a mobile communication apparatus (for example, a smartphone or a tablet).

As a further example, electronic apparatuses of a wearable type are known, such as smartbands or smartwatches, which can also be used for underwater applications or in general in-water applications.

In such apparatuses, pressure-sensor devices may be used, having a double full scale, a first full scale for detection of ambient pressure (or barometric pressure, for example for altitude or elevation monitoring) and a second (higher) full scale for detection of the higher pressures occurring in water (for example, for depth monitoring).

In these pressure-sensor devices, an automatic detection of entry into water may be implemented (i.e., of a variation of operating environment from the external environment, air, to the in-water or underwater environment), in order to automatically activate/deactivate some specific functions and, in particular, to automatically vary the full-scale value used for pressure detection.

In this regard, the change of full scale may be implemented by an appropriate adjustment of the gain factors of the reading electronics associated with pressure detection.

Automatic detection of the change in operating environment is in general implemented in the aforesaid electronic devices and apparatuses exclusively, or mainly, as a function of the detected pressure value.

For instance, in the case of wearable electronic apparatuses for audio applications, recognition of the in-ear state occurs when the pressure value detected by a pressure sensor integrated in the same apparatuses exceeds a certain threshold value. Advantageously, in order to reduce energy consumption, this pressure sensor can be generally kept in an inactive or stand-by condition and activated by a movement sensor (accelerometer) and/or by a proximity sensor, designed to provide an indication of the apparatus approaching the ear and of the insertion therein.

U.S. Pat. No. 10,491,981 B1 discloses in this regard a method for determining the current operating status of an earpiece, which includes a speaker and a pressure sensor. The method envisages processing of a pressure signal that indicates the air pressure in the proximity of the earpiece, in particular for detecting a variation of the same signal in response to insertion of the earpiece into the ear of a user. When the operating status of the earpiece is determined to be inside the ear, audio signal is provided for example through the speaker, and a wireless connection is established with a media player device for wireless data exchange between the earpiece and the same media player device.

In particular, in the solution described in the aforesaid document, a movement sensor is used for detecting a movement higher than a certain threshold to activate a proximity sensor; this proximity sensor is then used for detecting approach (below a certain threshold) of the device to the ear of the user and then to activate the pressure sensor, for consequent detection of the insertion into the auditory canal as a function of the value of the detected pressure signal.

As a further example, in the case of apparatuses for underwater applications or in general in-water applications, the automatic variation of the full scale of the pressure sensor is implemented when the detected pressure value exceeds a certain threshold higher than the air pressure or barometric pressure (in this case, activating an upper full scale), or is below a certain threshold lower than barometric pressure (in this case, activating a lower full scale), for a pre-set time interval.

The present inventors have found that the current solutions, however, have some limitations and suffer from some drawbacks.

In general, the possibility exists of errors (the so-called "false positives") in detection of the change in operating environment in so far as different events can in principle cause a variation of pressure that can be incorrectly interpreted as a change in the operating environment.

For instance, in the case of wearable electronic apparatuses, a false positive in the detection of entry into water may cause a variation, in this case undesired, of the full scale of the pressure sensor when the electronic apparatus is in actual fact still operating in air and/or an erroneous disabling of some of the functions of the apparatus.

In the example of wearable apparatuses for audio applications, a false detection of introduction of the apparatus into the ear can cause faulty activation of some functions of the same apparatus, for example an undesired reproduction of audio.

Furthermore, a particular disadvantage linked to the solution described in the aforesaid U.S. Pat. No. 10,491,981 B1 is due to the use of a large number of sensors (a movement sensor, a proximity sensor, and a pressure sensor), which entails a consequent non-negligible energy consumption.

BRIEF SUMMARY

The present disclosure provides various embodiments which at least partially overcome the drawbacks of the known systems, by providing a solution for detecting a change in operating environment having improved characteristics.

According to the present disclosure, a device and a method for detecting a change in operating environment are provided.

In at least one embodiment, a detection device is provided that includes a pressure sensor configured to provide a pressure signal indicative of an ambient pressure in an operating environment. An electrostatic-charge-variation sensor is configured to provide a charge-variation signal indicative of a variation of electrostatic charge associated with the operating environment. Processing circuitry is coupled to the pressure sensor and to the electrostaticcharge-variation sensor and configured to receive the pressure signal and the charge-variation signal and to jointly process the pressure signal and the charge-variation signal and detect a variation between a first operating environment and a second operating environment for the detection device. The second operating environment is different from the first operating environment.

In at least one embodiment, an electronic apparatus is provided that includes a detection device and a main controller coupled to the processing circuitry of the detection device and configured to receive a variation signal, indicative of the change in operating environment, for execution or activation of given actions in response to detection of the change in operating environment.

In at least one embodiment, a method for detecting a variation between a first operating environment and a second operating environment, different from the first operating environment, is provided that includes: receiving, from a pressure sensor, a pressure signal indicative of an ambient pressure in an operating environment; receiving, from an electrostatic-charge-variation sensor, a charge-variation signal indicative of a variation of electrostatic charge associated with said the operating environment; and jointly processing the pressure signal and the charge-variation signal and detecting the change between the first operating environment and the second operating environment, different from the first operating environment.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

As will be described in detail hereinafter, one aspect of the present solution provides, for detection of a change in operating environment, a detection device based on the joint use, in combination, of a pressure sensor and of an electrostatic-charge-variation sensor.

As it is known, the electrical charge is a fundamental component of nature. The electrical charge of an electrostatically charged body can be easily transferred to another body, in a condition of direct contact between the elements or at a distance. When the charge is transferred between two electrically insulated objects, a static charge is generated whereby the object with an excess of electrons is charged negatively and the object with a deficit of electrons is charged positively. The displacement of charges is of a different nature according to whether the object is a conductive object or a dielectric. In a conductor, the electrons are distributed throughout the material and are free to move, due to external electrical fields. In a dielectric, no electrons are free to move except electrical dipoles, with random directions in space (therefore with zero net resulting charge), which, however, can be oriented or deformed by an external electrical field, thus generating an orderly distribution of charges and therefore a biasing. The charge may in any case be mobile, according to the properties of the material and other environmental factors.

In the present solution, the electrostatic-charge-variation sensor of the detection device is configured to detect, by capacitive detection, the variations of electrical field (and therefore of electrostatic potential) that occur in time as a result of charge redistribution due to a change in the operating environment in which the electronic apparatus operates.

Figure 1:
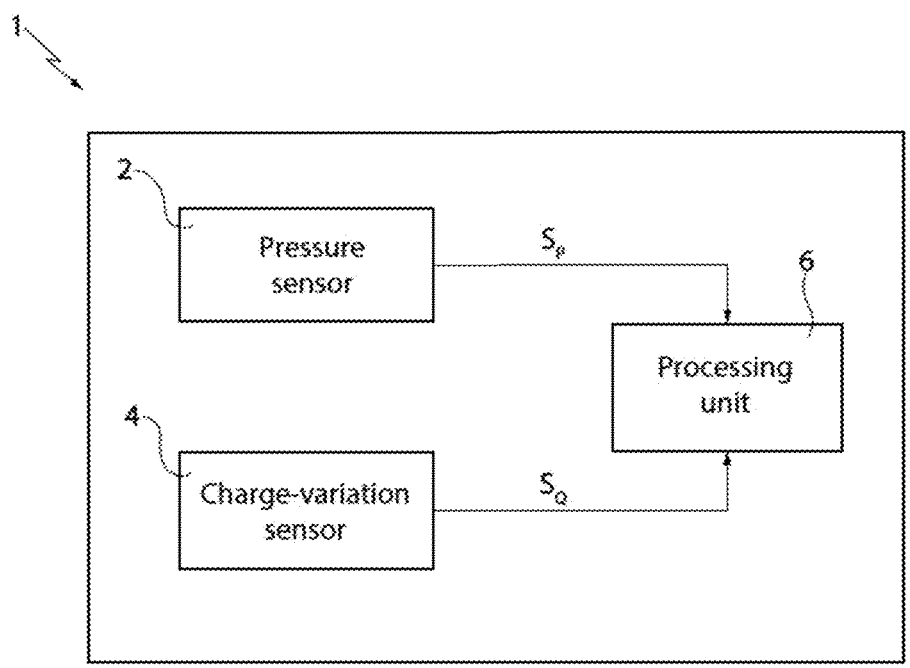
FIG. 1 is a general block diagram of a detection device according to an embodiment of the present solution.

FIG. 1 is a schematic illustration of a detection device 1 according to an embodiment of the present solution, which comprises:

a pressure sensor 2, in particular a MEMS (Micro Electro Mechanical System) semiconductor sensor, of a known type not described in detail herein, configured to provide a pressure signal $S_P$, associated with the pressure in the operating environment in which the detection device 1 and a corresponding electronic apparatus (where the detection device 1 is used) are located;

an electrostatic-charge-variation sensor 4, which will be described in detail hereinafter, configured to provide a charge-variation signal $S_Q$ indicative of a variation of electrostatic charge in the aforesaid operating environment; and processing circuitry (which may be referred to herein as a processing unit) 6, coupled to the pressure sensor 2 and to the electrostatic-charge-variation sensor 4 in order to receive the pressure signal $S_P$ and the charge-variation signal $S_Q$ and configured to jointly process the aforesaid pressure signal $S_P$ and charge-variation signal $S_Q$ for detecting a change in operating environment. The processing circuitry may include any circuitry configured to perform the various functionalities described herein with respect to the processing circuitry, and in some embodiments, the processing circuitry may be or include a microcontroller or the like.

Figure 2:
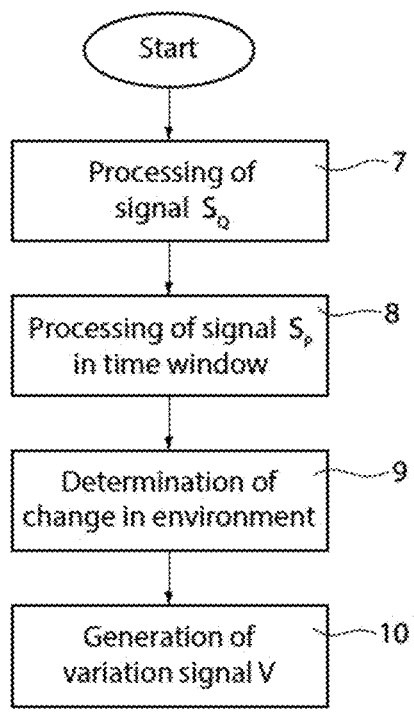
FIG. 2 shows a general flowchart of a method implemented by the detection device of FIG. 1 according to an embodiment of the present solution.

In general, with reference to FIG. 2, the processing unit 6 is configured to execute, as shown in step 7, processing of the charge-variation signal $S_Q$, in particular for comparison of at least one corresponding parameter (for example, the absolute value or a variance) with a pre-set threshold associated with the same parameter.

If the comparison has a positive outcome (for example, if the absolute value or variance of the charge-variation signal $S_Q$ satisfies a given relation with the pre-set threshold, for example being higher than the same threshold), the processing unit 6 is configured to execute, step 8, a processing of the pressure signal $S_P$, in particular for comparison of at least one corresponding parameter (for example, the absolute value or a gradient or time difference or a slope) with a respective pre-set threshold associated with the same parameter.

If also the further comparison has a positive outcome, within a pre-set control time window subsequent to the aforesaid positive outcome of the comparison of the charge-variation signal $S_Q$, the processing unit 6 is configured to determine occurrence, step 9, of a change in operating environment, from a first operating environment (for example, air) to a second, different, operating environment (for example, the inside of the auditory canal or the underwater environment).

After this determination, the processing unit 6 may generate and provide at its output a variation signal V, for example of a pulsed type, indicative of the aforesaid change in operating environment, step 10.

In a way not illustrated herein, the variation signal V can be received by a management and control unit of an electronic apparatus in which the detection device 1 is arranged, in order to execute and activate given actions in response to the detection of change in operating environment (for example, activate reproduction of multimedia audio, in case of a wearable apparatus for audio applications, or modification of the full scale of the pressure sensor, in case of an apparatus for underwater use).

In the case where any one of the aforesaid checks do not, instead, have a positive outcome, the algorithm executed by the processing unit 6 returns to the initial step, for preliminary processing of the charge-variation signal $S_Q$, and possible start of a new control time window.

Advantageously, joint processing of the charge-variation signal $S_Q$ and of the pressure signal $S_P$ enables elimination, or at least reduction, of false detections of change in operating environment, for example due to pressure variations independent of a variation of operating environment and due to further and different factors.

Moreover, as will on the other hand be clarified hereinafter, the resulting energy consumption of the detection device 1 is small, thanks to the low energy consumption required by the charge-variation sensor 4 and to the possible activation of the pressure sensor 2 only within the control time window subsequent to the positive outcome of processing of the charge-variation signal $S_Q$.

In greater detail, the aforesaid processing unit 6 comprises, for example, a microcontroller, or an MLC (Machine Learning Core) processor resident in an ASIC (Application-Specific Integrated Circuit) coupled to the pressure sensor 2 and to the electrostatic-charge-variation sensor 4 for processing of the corresponding pressure signal $S_P$ and charge-variation signal $S_Q$. The aforesaid pressure sensor 2, electrostatic-charge-variation sensor 4, and processing unit 6 may be provided within a same package having appropriate elements for electrical connection towards the outside environment, for example for connection with a host electronic apparatus.

In other words, in a possible implementation, the charge-variation sensor 4 may be integrated with the pressure-variation sensor 2.

Figure 3A:
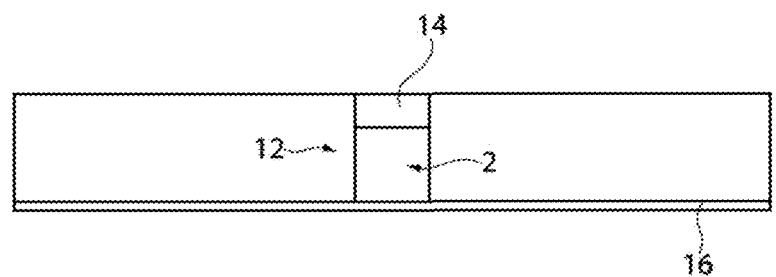
FIGS. 3A-3B are schematic cross-sectional views of possible embodiments of the detection device of FIG. 1.

In this regard, as illustrated schematically in FIG. 3A, the pressure sensor 2 may comprise a package 12, having a cap or outer protective element made of metal, designed to operate as a detection electrode 14 of the charge-variation sensor 4. The pressure sensor 2 is moreover electrically coupled to a printed-circuit board (PCB) 16. In a way not illustrated, the reading and processing electronics associated with the pressure sensor 2 and with the charge-variation sensor 4 may be integrated within the package 12, or provided externally and coupled to the PCB 16.

Figure 3B:
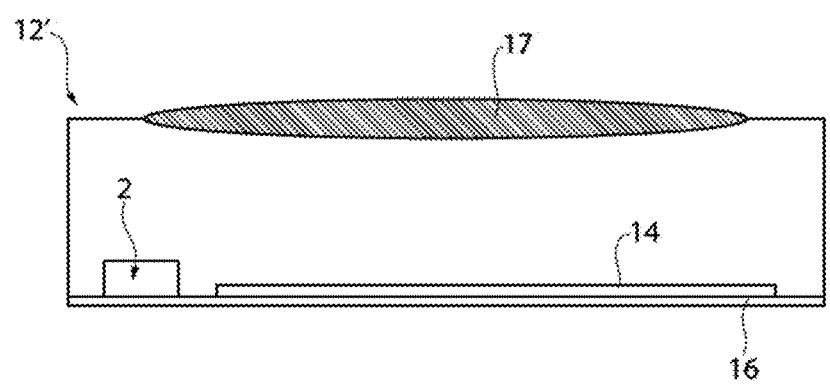

Alternatively, as indicated schematically in FIG. 3B, both the pressure sensor 2 and the aforesaid detection electrode 14 of the charge-variation sensor 4 may be coupled to the PCB 16, arranged within a package 12' in this case provided with a protective membrane 17 as an interface in regard to the external environment. In a way not illustrated, also in this case the reading and processing electronics associated with the pressure sensor 2 and with the charge-variation sensor 4 can be integrated within the package 12' or provided externally and coupled to the PCB 16.

Figure 4:
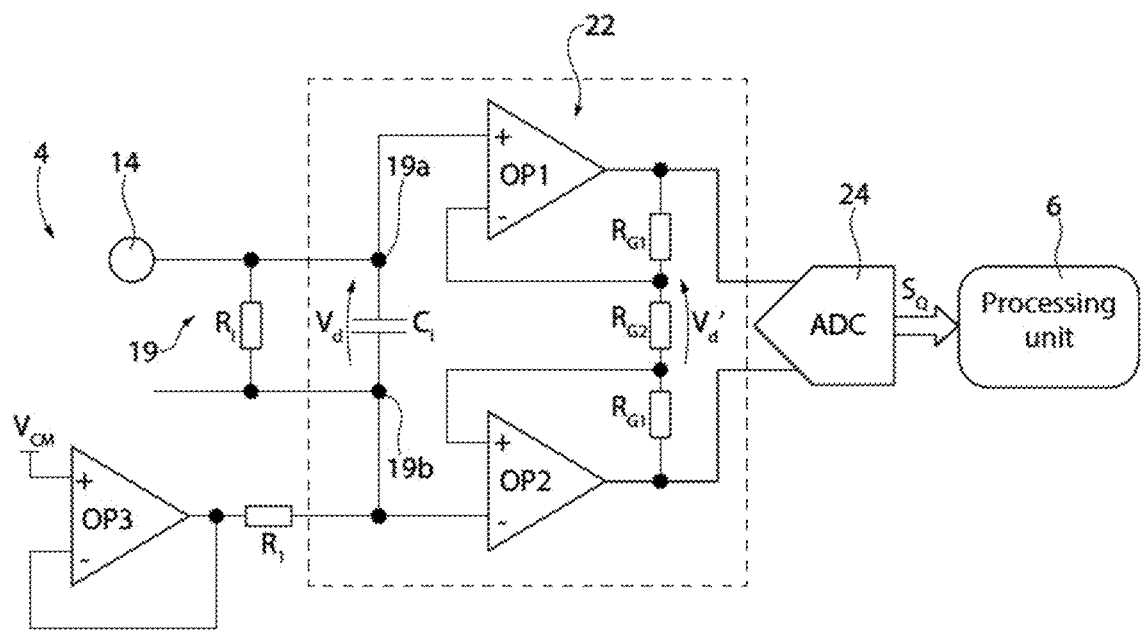
FIG. 4 illustrates a possible circuit implementation of an electrostatic-charge-variation sensor of the detection device of FIG. 2.

FIG. 4 illustrates an embodiment presented by way of non-limiting example of the electrostatic-charge-variation sensor 4, which comprises at least one input electrode, in particular the aforesaid detection electrode 14, designed to be arranged facing, or in the proximity of, the operating environment for detection of the environmental charge-variation (and of the consequent field and electrical potential variation).

The detection electrode 14 is part of a differential input 19 of an instrumentation amplifier 22, being coupled to a corresponding first input terminal 19a.

Between the first input terminal 19a and a second input terminal 19b of the differential input 19 an input capacitor $C_1$ and an input resistor $R_1$ are connected in parallel to one another.

During operation, an input voltage $V_d$ across the input capacitor $C_1$ varies due to the charge redistribution in the external environment, in particular due to a change in the operating environment of the detection device 1. After a transient (the duration of which is given by the constant $R_1 \cdot C_1$ defined by the parallel between the capacitor $C_1$ and the resistor $R_1$), the input voltage $V_d$ returns to its steady-state value.

The instrumentation amplifier 22 is basically constituted by two operational amplifiers OP1 and OP2, having non-inverting input terminals connected to the first input terminal 19a and, respectively, the second input terminal 19b and inverting terminals connected together by a gain resistor $R_{G2}$.

A biasing stage (buffer) OP3 biases the instrumentation amplifier 22 to a common-mode voltage $V_{CM}$, through a resistor $R_1$ coupled to the second input terminal 19b.

The output terminals of the operational amplifiers OP1 and OP2 are connected to the respective inverting input terminals by a respective gain resistor $R_{G1}$; an output voltage $V_d'$ is present between the same output terminals.

As will be clear from an examination of the circuit, the gain Ad of the instrumentation amplifier 22 is $(1+2 \cdot R_1/R_2)$; consequently, the aforesaid output voltage $V_d'$ is $V_d \cdot (1+2 \cdot R_1/R_2)$.

The components of the instrumentation amplifier 22 are chosen so that the same instrumentation amplifier 22 has a reduced noise and a high impedance (for example, of the order of $10^9 \Omega$) in its passband (for example, comprised between 0 and 500 Hz).

The aforesaid output voltage $V_d'$ is provided at the input of an analog-to-digital converter (ADC) 24, which provides at its output the aforesaid charge-variation signal $S_Q$ for the processing unit 6. The charge-variation signal $S_Q$ may, for example, be a high-resolution (16-bit or 24-bit) digital stream.

According to a different embodiment, if an analog-to-digital converter 24 with appropriate characteristics (for example, differential input, high input impedance, high resolution, dynamic range optimized for the quantities to be measured, low noise) is available, the instrumentation amplifier 22 may be omitted, in this case the input voltage $V_d$ being directly supplied at the input of the analog-to-digital converter 24.

In a way not illustrated, the charge-variation signal $S_Q$ may be supplied to a first input of a multiplexer block, which may moreover receive on at least one further input the aforesaid pressure signal $S_P$ (and possibly, on further inputs, further sensing signals). The output of the multiplexer block is in this case coupled to an input of the processing unit 6 and supplies, sequentially in time, the aforesaid charge-variation signal and pressure signal $S_Q$, $S_P$ (and possibly further sensing signals) for enabling processing by the processing unit 6.

Figure 5:
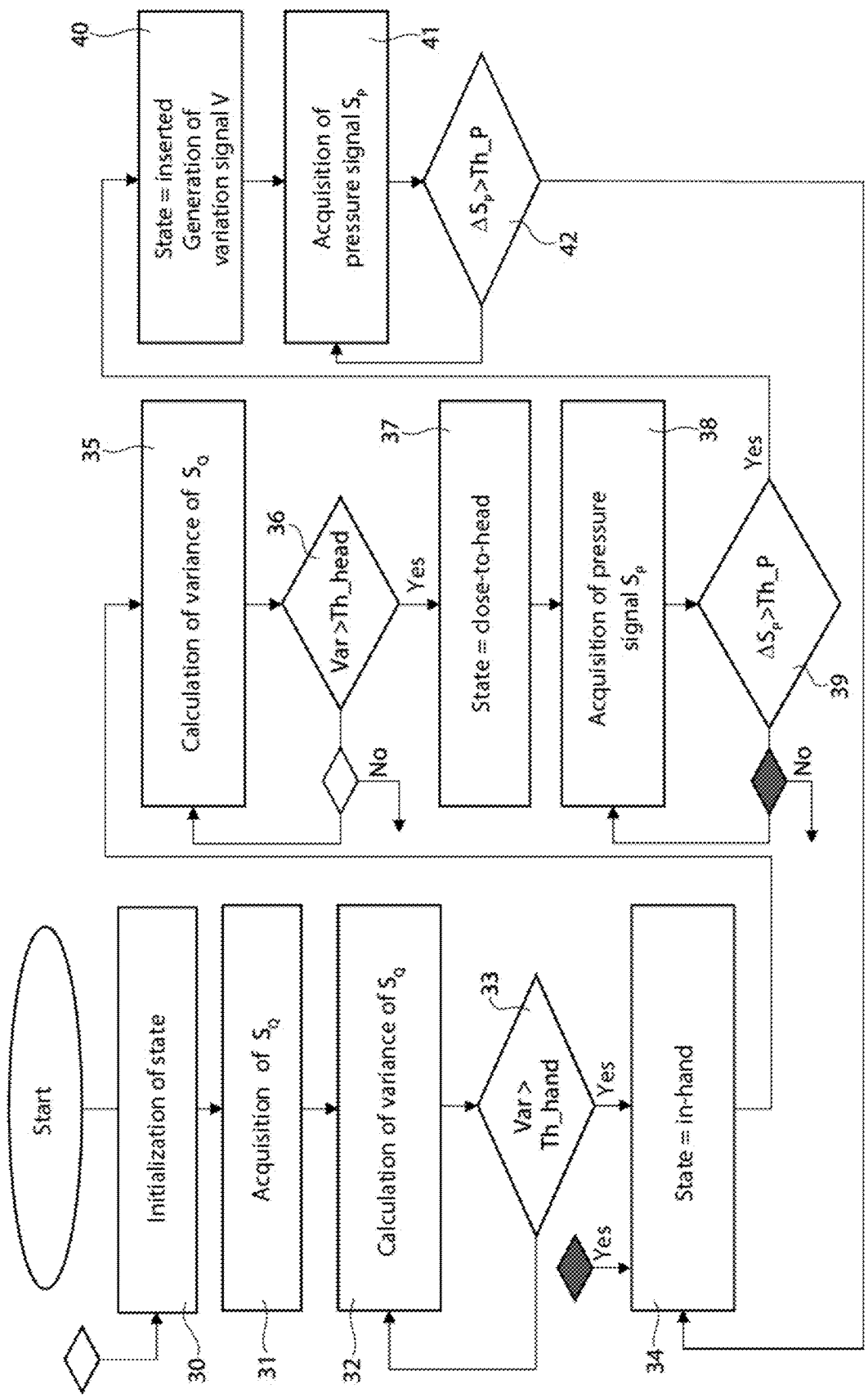
FIGS. 5 and 6 show respective flowcharts of a method implemented by the detection device of FIG. 1 for detection of insertion of an electronic apparatus for audio applications into the ear of a user.

FIG. 5 shows in greater detail, by means of a flowchart, the operations of joint processing of the charge-variation and pressure signals $S_Q$, $S_P$ executed by the processing unit 6, in a possible embodiment of the present solution. In particular, this embodiment regards the use of the detection device 1 in a wearable apparatus for audio applications (for example, an earpiece) in order to detect entry/exit of the apparatus into/from the auditory canal of a user.

In detail, in this embodiment, the processing unit 6 is initially configured to initialize, block 30, a state variable, which, as will be discussed hereinafter, can have three values: 'in-hand' (indicative of the fact that the wearable apparatus is in the hand of the user); 'close-to-head' (indicative of the fact that the wearable apparatus is located in the proximity of the head of the user); 'inserted' (indicative of the fact that the wearable apparatus has been inserted into the auditory canal). In particular, initialization of the state variable corresponds to a position where the apparatus is laid on a table or on any resting surface.

The charge-variation signal $S_Q$ is then acquired, block 31, in particular corresponding samples thereof are acquired (for example, stored in an acquisition buffer that is progressively supplied with and updated by the same samples), and moreover subjected to an operation of normalization (for example, by removal of a corresponding base value).

Next, block 32, in a per se known manner, the variance Var of the charge-variation signal $S_Q$ is calculated, this variance here representing the processed parameter of the same charge-variation signal $S_Q$.

The variance of the charge-variation signal $S_Q$ is compared, block 33, with a first threshold Th_hand of a pre-set value, indicative of the fact that the apparatus is in the hand of the user (it should be noted that the value of this first threshold Th_hand can be determined, for example, in an initial calibration stage). In some embodiments, the first threshold Th_hand may be stored, for example, in computer-readable memory such as within the processing unit 6 and may be compared with the charge-variation signal $S_Q$ by any suitable circuitry, such as a digital comparator which may be included with the processing unit 6.

If the aforesaid variance is higher than the first threshold Th_hand, the state variable is updated to the value 'in-hand,' block 34.

Then, block 35, the algorithm proceeds with calculation of the variance of the charge-variation signal $S_Q$ (on the basis of new samples received in the meantime, having filled the buffer).

The aforesaid variance of the charge-variation signal $S_Q$ is compared, block 36, with a second threshold Th_head (possibly of a value equal to the first threshold Th_hand) having a respective pre-set value, indicative of the fact that the apparatus is in the proximity of the head of the user (it should be noted that also the value of the aforesaid second threshold Th_head may be determined, for example, in an initial calibration stage). In some embodiments, the second threshold Th_head may be stored, for example, in computer-readable memory such as within the processing unit 6 and may be compared with the charge-variation signal $S_Q$ by any suitable circuitry, such as a digital comparator which may be included with the processing unit 6.

If the aforesaid variance is higher than the second threshold Th_head, the state variable is updated to the value 'close-to-head,' block 37.

Instead, if the variance is not higher than the second threshold Th_head for the duration of a given time interval, the state variable returns to the initial value, block 30.

Next, block 38, the processing unit 6 activates the pressure sensor 2 (which so far has been kept disabled for energy-saving purposes) and acquires the pressure signal $S_P$; in particular, corresponding samples thereof are acquired (for example, being stored in an acquisition buffer that is progressively supplied with and updated by the same samples).

The absolute value, or gradient $\Delta$ (i.e., the difference between samples consecutive in time), of the pressure signal $S_P$ is compared, block 39, with a third threshold Th_P, of a pre-set value (it should be noted that also the value of said third threshold Th_P may be determined, for example, in an initial calibration stage). In some embodiments, the third threshold Th_P may be stored, for example, in computer-readable memory such as within the processing unit 6 and may be compared with the gradient $\Delta$ by any suitable circuitry, such as a digital comparator which may be included with the processing unit 6.

If the value of the aforesaid parameter of the pressure signal $S_P$ is higher than the third threshold Th_P, the state variable is updated to the value 'inserted,' block 40.

Instead, if the value of the aforesaid parameter of the pressure signal $S_P$ is not higher than the third threshold Th_p for the entire duration of a given time interval, the state variable returns to the value 'in-hand,' block 34.

In response to the determination of insertion of the wearable apparatus into the user's ear, as illustrated in the same block 40, the processing unit 6 is further configured to generate the variation signal V of a pulsed type, indicative of the aforesaid change in operating environment (in other words, the variation signal V switches value; for example, it passes from a low value to a high value).

The above variation signal V can be received by a managing unit for managing the wearable apparatus in which the detection device 1 is incorporated, in order to execute and activate given actions in response to the detection of change in operating environment (for example, activate reproduction of multimedia audio files or transfer of data between the detection device 1 and the same wearable apparatus).

Next, the processing unit 6 is configured to monitor exit of the wearable apparatus from the user's ear; in this embodiment, monitoring is based on processing of the aforesaid parameter (the absolute value, or the gradient) of the pressure signal $S_P$, block 41.

In particular, block 42, if the parameter (for example the gradient $\Delta$) of the pressure signal $S_P$ is once again higher than the aforesaid third threshold Th_p, the processing unit 6 determines exit of the apparatus from the user's ear, so that the algorithm returns to block 34, with updating of the state variable to the value 'in-hand.' The variation signal V moreover switches value (for example, passes from the high value to the low value) so as to cause deactivation of the actions previously activated in response to detection of change in operating environment (for example, reproduction of multimedia audio files or transfer of data between the detection device 1 and the wearable apparatus are interrupted).

Figure 6:
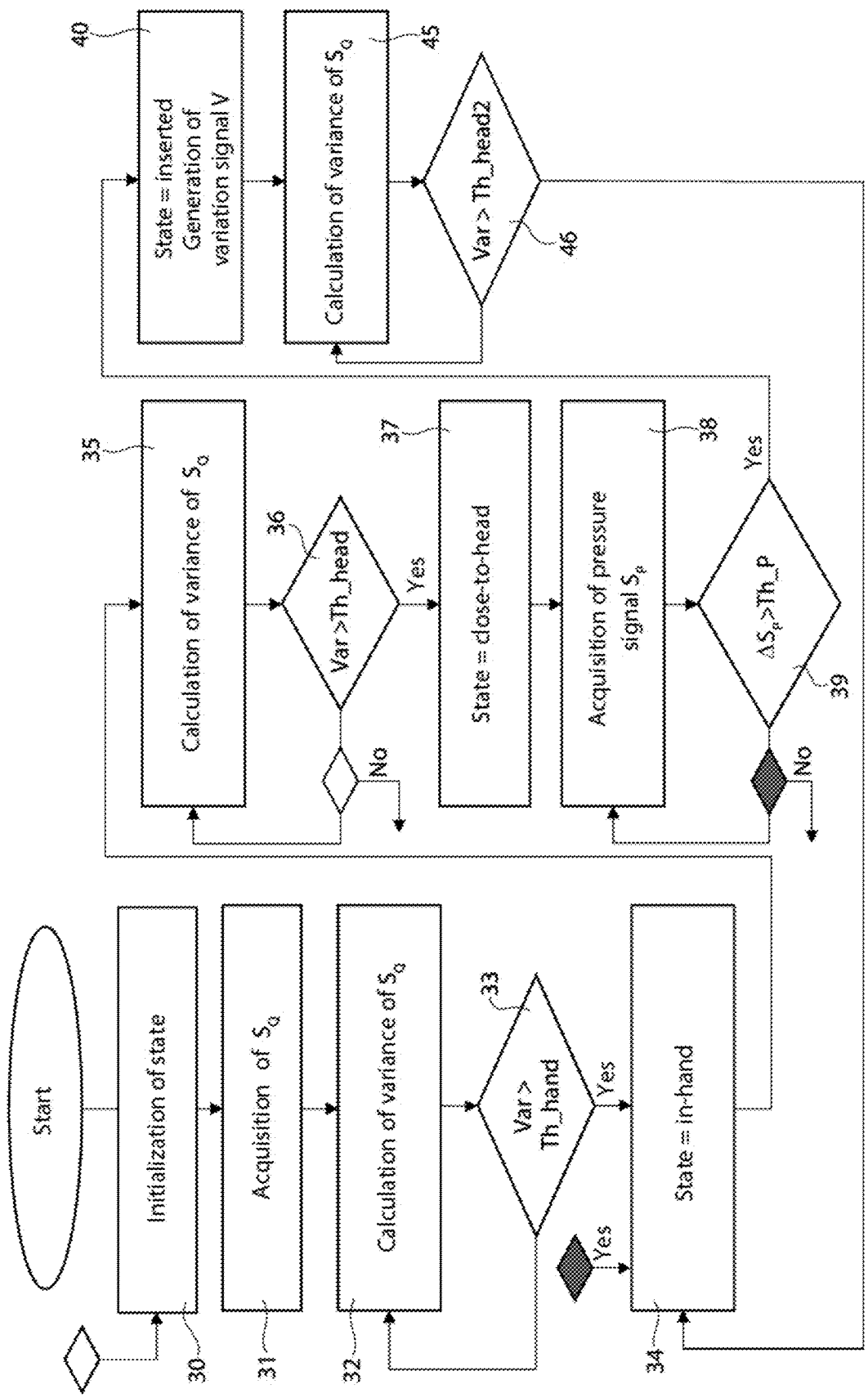

In a further embodiment, illustrated in FIG. 6, the algorithm executed by the processing unit envisages the same steps as the ones described previously up to block 40 (these steps are consequently designated by the same reference numbers and are not described again), where the variation signal V switches value following upon detection of the change in operating environment (having verified that the value of the aforesaid parameter of the pressure signal $S_P$ is higher than the third threshold Th_p).

In this case, the processing unit 6 is configured to monitor exit of the wearable apparatus from the user's ear based on the processing of the charge-variation signal $S_Q$.

In particular, the variance of the charge-variation signal $S_Q$ is once again calculated, block 45.

Then, block 46, if the variance of the charge-variation signal $S_Q$ is higher than a fourth threshold Th_head2 (which also has a value that can be determined for example in an initial calibration stage), the processing unit 6 determines exit of the wearable apparatus from the user's ear, so that the algorithm returns to block 34, with updating of the state variable to the value 'in-hand.' The variation signal V moreover switches value, with the consequences discussed previously.

Figure 7:
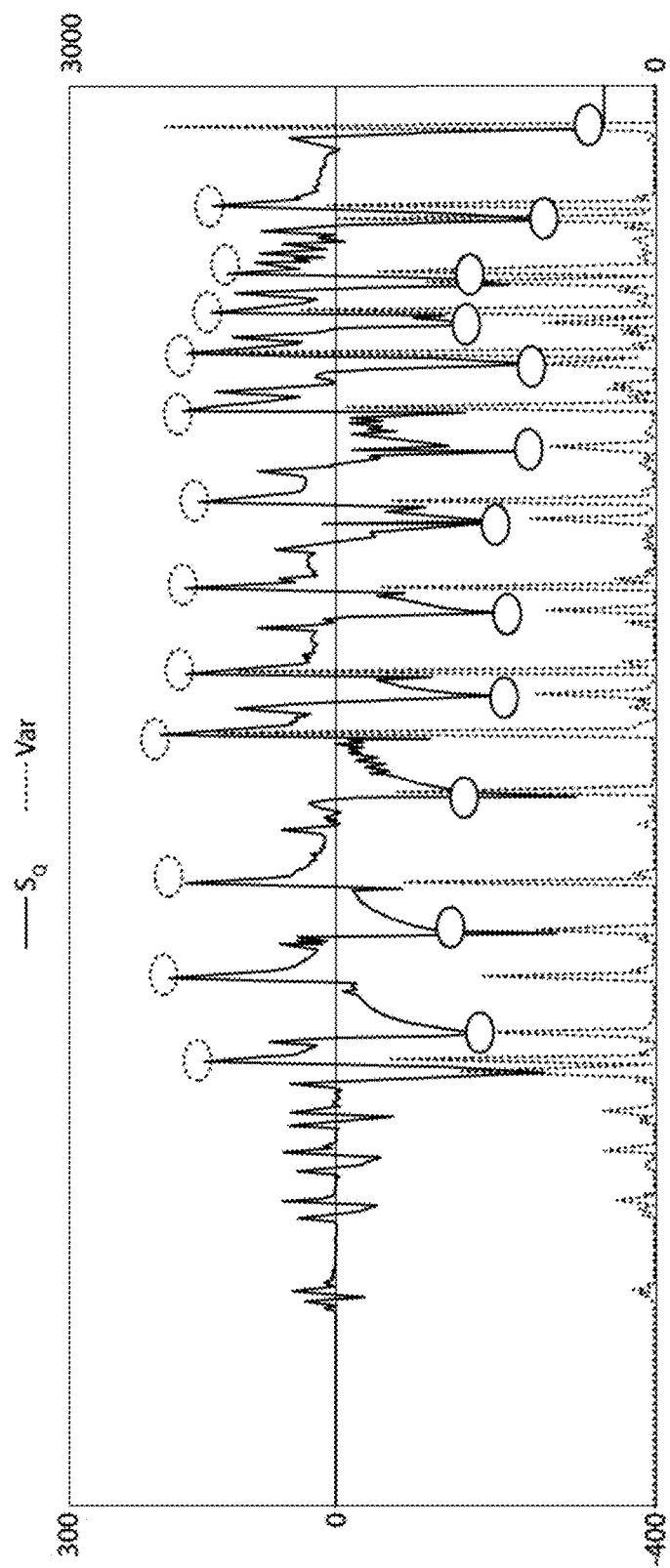
FIG. 7 shows plots of an electrostatic-charge variation signal associated with detection of a change in operating environment.

FIG. 7 shows, in relation to what has just been discussed, the time plot of the charge-variation signal $S_Q$ and of the corresponding variance (Var), during experimental tests conducted by the present Applicant. The events (recognizable in a clear and evident way from an analysis of the plots, in particular of the peaks, of the aforesaid signals) of recognition of the position of the wearable apparatus in the user's hand and in the proximity of the user's ear are highlighted (it should be noted that in this test, the user repeatedly gets hold of the aforesaid wearable apparatus and inserts it in his ear).

In particular, the circle with a solid line represents the in-hand event. When the user gets hold of the wearable apparatus, the charge-variation signal $S_Q$ shows a small positive peak and then a marked negative peak, distinguished by the aforesaid circle with solid line. While the wearable apparatus is held in the user's hand, the charge-variation signal $S_Q$ then shifts towards a zero value. When, instead, the wearable apparatus is brought towards the head, the charge-variation signal $S_Q$ shows a positive peak and then returns once again towards the zero value. The circle with a dashed line represents the event of proximity of the apparatus to the user's head.

The aforesaid events are particularly evident in the plot of the variance of the charge-variation signal $S_Q$, where peaks are readily recognizable (in the example of a lower and a higher value) related to recognition of the 'in-hand' event and the 'close-to-head' event, respectively.

Figure 8:
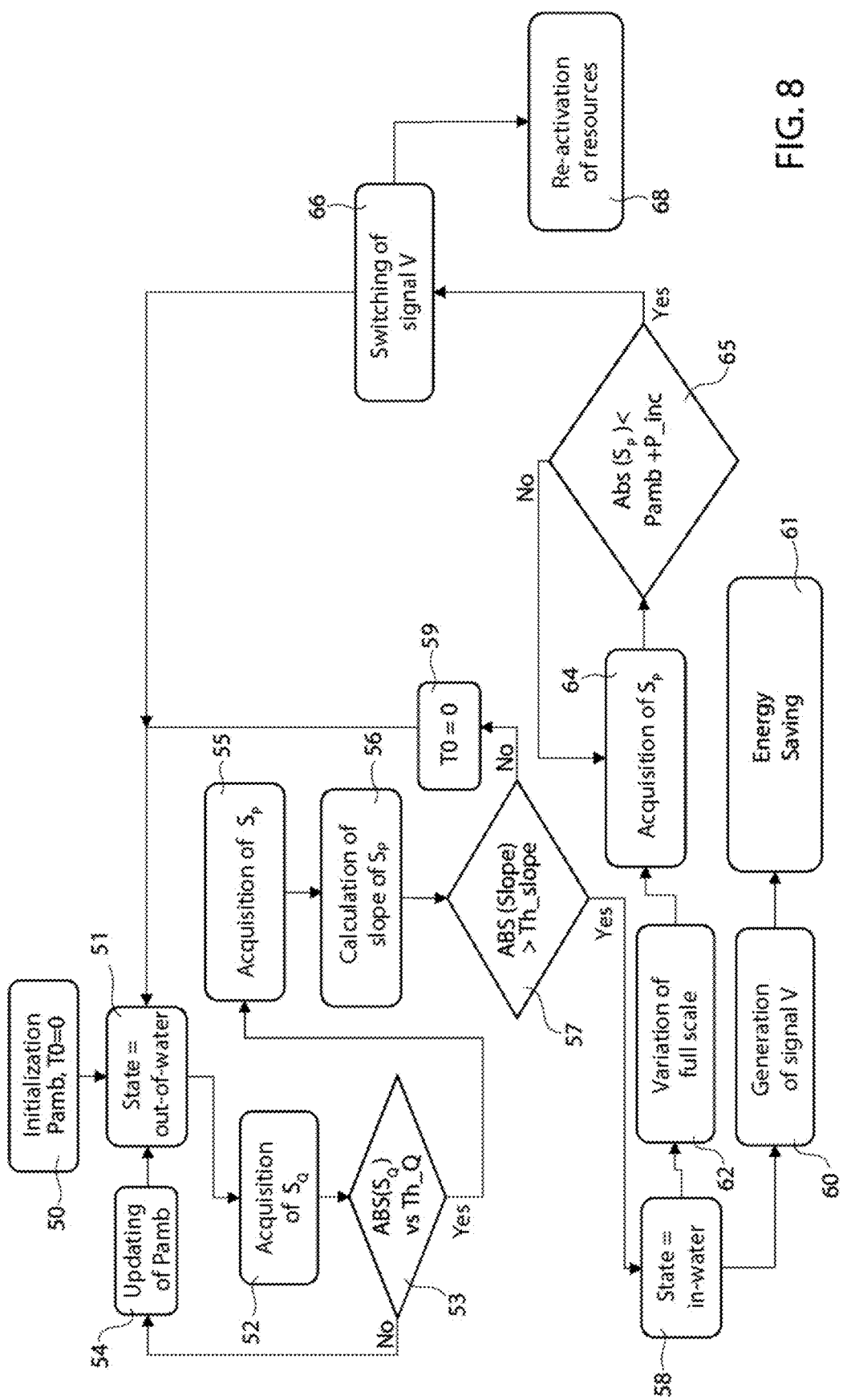
FIG. 8 shows a flowchart of a method implemented by the detection device of FIG. 1, for detection of entry of an electronic apparatus into water.

FIG. 8 illustrates, by means of a flowchart, the operations of joint processing of the charge-variation and pressure signals $S_Q$, $S_P$ executed by the processing unit 6, in a further embodiment of the present solution. In particular, this embodiment regards the use of the detection device 1 in a wearable apparatus for underwater or generally in-water applications (for example, in a smartband or smartwatch) in order to detect the entry and/or exit of the apparatus into/from the water.

In detail, in this embodiment, the processing unit 6 is initially configured, block 50, to detect by means of the pressure sensor 2 the value of the atmospheric or barometric pressure, which is initialized and stored in an ambient-pressure variable Pamb. In addition, the value of a time variable T0 is initialized to zero (as will be discussed hereinafter, this time variable will enable definition of the control time window, during which checking the information provided by the pressure sensor 2 following detection of a potential event of change in operating environment by means of the charge-variation sensor 4).

Initially, moreover, as illustrated in block 51, the state variable is set at the value 'out-of-water' and may moreover assume the value 'in-water' once entry of the wearable apparatus into the water is detected (as described hereinafter).

The charge-variation signal $S_Q$ is then acquired, block 52. In particular, corresponding samples thereof are acquired (for example, stored in an acquisition buffer that is progressively supplied with and updated by the same samples), and moreover subjected to an operation of normalization (for example, by removal of a corresponding base value).

Then, block 53, the absolute value of the charge-variation signal $S_Q$ is compared with a first threshold Th_Q, of a pre-set value, indicative of a possible change in operating environment (it should be noted that the value of this first threshold Th_Q may be determined, for example, in an initial calibration stage).

If the aforesaid absolute value is not higher than the first threshold Th_Q, the algorithm proceeds to block 54, where the value of the ambient-pressure variable Pamb is updated, after which the algorithm returns to block 51.

Otherwise, if the aforesaid absolute value is higher than the first threshold Th_Q, the algorithm proceeds with processing of the pressure signal $S_P$. In particular, block 55, the processing unit 6 acquires the pressure signal $S_P$; i.e., corresponding samples thereof are acquired (for example, stored in an acquisition buffer that is progressively supplied with and updated by the same samples).

Then, block 56, the time-slope of the aforesaid pressure signal $S_P$ (in this case, the slope corresponding to the processed parameter) is calculated, in a per se known manner, in particular in a time interval comprised between T0 (current value of the time variable) and T0+ΔT (an appropriately incremented value of the same time variable).

The absolute value of the aforesaid slope is compared, block 57, with a second threshold Th_slope, of a pre-set value (it should be noted that also the value of this second threshold Th_slope may be determined, for example, in an initial calibration stage).

If, within the given time interval, the value of the aforesaid parameter of the pressure signal $S_P$ is higher than the second threshold Th_slope, the state variable is updated to the value 'in-water,' block 58.

Instead, if the value of the aforesaid parameter of the pressure signal $S_P$ is not higher than the second threshold Th_slope in the given time interval, the algorithm moves to block 59, where the value of the time variable T0 is re-initialized to the zero value, and then to the aforesaid block 51.

In response to determination of entry into water of the wearable apparatus, the processing unit 6 is moreover configured to generate the variation signal V, of a pulsed type, indicative of the aforesaid change in operating environment, block 60. In other words, the variation signal V switches value, for example passing from the low value to the high value.

The variation signal V may be received by a management and control unit of the wearable apparatus in which the detection device 1 is incorporated, in order to execute and activate given actions in response to detection of change in operating environment (for example, disable some functions of the wearable apparatus, as indicated in block 61, for energy-saving purposes).

Furthermore, block 62, the processing unit 6 controls variation of the full-scale value of the pressure sensor 2, which switches from a first, low, value to a second, high, value (for example being two times higher) so as to enable detection of the high values of pressure that can occur in the underwater environment.

Next, the processing unit 6 is configured to monitor exit of the wearable apparatus from the water. In the present embodiment, this monitoring is based on processing of just the pressure signal $S_P$.

In particular, block 64, new samples of the pressure signal $S_P$ are acquired.

If it is found, block 65, that the absolute value of the pressure signal $S_P$ is lower than the value of the ambient pressure Pamb, appropriately incremented by an incremental value P_inc, for the entire duration of a respective time interval, the processing unit 6 determines exit from the water, so that the algorithm returns to block 51, with updating of the state variable to the value 'out-of-water.' The variation signal V moreover switches value, for example, passing from the high value to the low value, block 66, so as to cause, for example, re-activation of the resources previously disabled in response to the detection of change in operating environment, as indicated in block 68.

In the aforesaid block 65, the processing unit 6 may moreover be configured to verify further conditions on the pressure signal $S_P$, for example that a corresponding variation remains below a respective variation threshold for the entire duration of the respective time interval, in order to determine exit from the water only in case both conditions are simultaneously verified.

Figure 9:
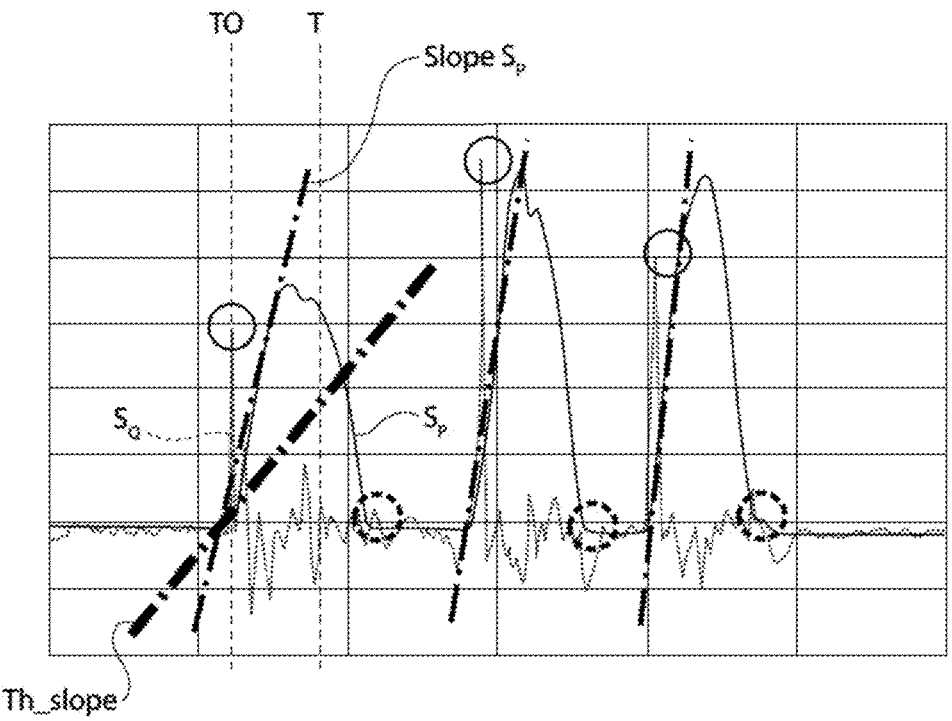
FIG. 9 shows plots of an electrostatic-charge variation signal and of a pressure signal associated with detection of a change in operating environment.

FIG. 9 shows, in relation to what has just been discussed, the time plots of the charge-variation signal $S_Q$ and of the pressure signal $S_P$, in the case of experimental tests conducted by the present Applicant. The events (recognizable in a clear and evident way from an analysis of the plots of the aforesaid signals) of recognition of the change in operating environment are highlighted (it should be noted that in this test, the aforesaid wearable apparatus repeatedly enters the water and then exits from the water). In the aforesaid FIG. 9 the slope of the pressure signal $S_P$ and the second threshold Th_slope are moreover indicated.

In particular, the solid-line circle represents the event of entry into the water, and the dashed-line circle represents the event of exit from the water (the exit event being clearly identifiable by return of the pressure signal $S_P$ to the initial atmospheric-pressure value).

It may be noted that, when the wearable apparatus enters the water, the charge-variation signal $S_Q$ has an evident positive peak; moreover, the slope of the pressure signal $S_P$ remains higher than the second threshold Th_slope for the entire duration of the time interval T (starting from the initial instant T0).

Figure 10:
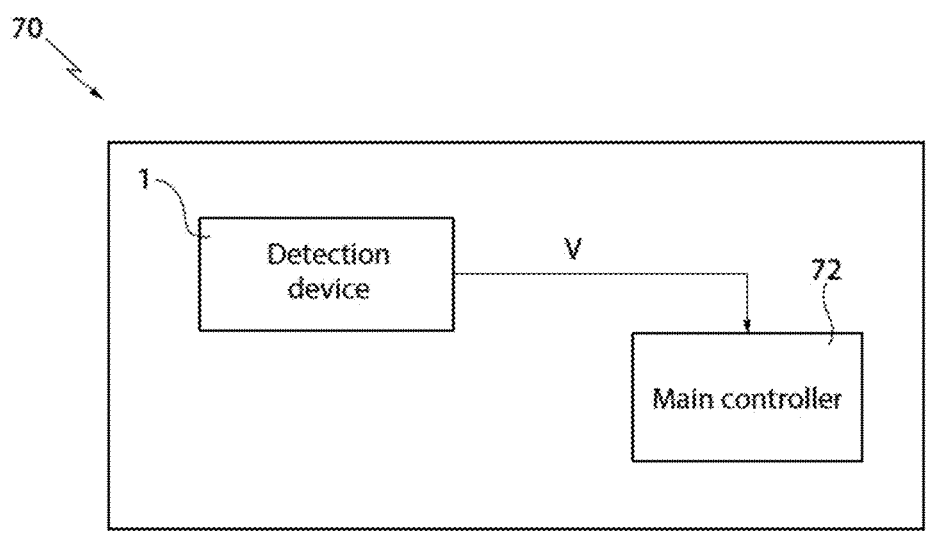
FIG. 10 is a general block diagram of an electronic apparatus in which the detection device of FIG. 1 can be used.

FIG. 10 is a schematic illustration of an electronic apparatus 70, in particular of a wearable type (for example, the aforesaid earpiece or the aforesaid smartband or smartwatch) that includes the previously described detection device 1.

The electronic apparatus 70 comprises a main controller 72 (a microcontroller, a microprocessor, or a similar digital processing unit), coupled to the processing unit 6 of the detection device 1 in order to receive information regarding the change in operating environment.

In the embodiment described previously, the main controller 72 receives, for example, from the processing unit 6 of the detection device 1, the variation signal V, to activate or deactivate given functions, as described in detail previously.

The advantages afforded by the present solution emerge clearly from the foregoing description.

In any case, it is once again underlined that in the detection device 1, monitoring of charge variation allows to complement the information associated with the sole detection of pressure, enabling elimination or in any case a marked reduction of the number of false detections (false positives).

The detection device 1 moreover has an optimized energy consumption (the consumption associated with the charge-variation sensor 4 and with the corresponding electronics is very low, and moreover the pressure sensor 2 can be activated only in case of effective need, at least in certain embodiments) and a reduced occupation of space (in particular, with the possibility of integration in a single package of both detection, pressure and charge variation technologies).

Finally, modifications and variations may be made to the present solution, without thereby departing from the scope identified by the appended claims.

For instance, in a way not illustrated, appropriate filtering operations may be envisaged (for example, using lowpass filters or highpass filters) for the pressure signal $S_P$ and charge-variation signal $S_Q$, preliminary to the processing operations described.

In a way not illustrated, the detection device 1 may integrate further sensors and envisage further dedicated processing channels for other detection operations.

It is once again underlined that the detection device 1 may be provided in a single chip that incorporates the charge-variation sensor 4 (and the corresponding electronic circuitry), the pressure sensor 2, and the processing unit 6; alternatively, the charge-variation signal $S_Q$ and the pressure signal $S_P$ may be processed in the main controller 72 of the electronic apparatus 70 in which the detection device 1 is incorporated (see the aforesaid FIG. 10).

In addition, it is pointed out that the input electrode (or detection electrode 14) of the electrostatic-charge-variation sensor 4 may even be a simple conductive probe; a metal plane in a PCB; a flexible PCB with a metal path; or any conductive element that may operate as detection electrode designed to be arranged facing the operating environment in order to detect the environmental-charge variation.

A detection device (1), may be summarized as including a pressure sensor (2), configured to provide a pressure signal (SP) indicative of an ambient pressure in an operating environment; an electrostatic-charge-variation sensor (4), configured to provide a charge-variation signal (SQ) indicative of a variation of electrostatic charge associated with said operating environment; and a processing unit (6), coupled to the pressure sensor (2) and to the electrostatic-charge-variation sensor (4) so as to receive the pressure signal (SP) and the charge-variation signal (SQ) and configured to jointly process said pressure signal (SP) and said charge-variation signal (SQ) for detecting a variation between a first operating environment and a second operating environment for said detection device (1), the secondo operating environment being different from said first operating environment.

Said processing unit (6) may be configured to execute processing of the charge-variation signal (SQ) for a first comparison of at least one corresponding parameter with a pre-set threshold associated with said parameter; if the first comparison has a positive outcome, execute processing of the pressure signal (SP) for a second comparison of at least one respective parameter with a respective pre-set threshold associated with said respective parameter; if the aforesaid second comparison has a positive outcome, within a pre-set control time window subsequent to the aforesaid positive outcome of the first comparison, determine the occurrence of the change in operating environment.

After detection of said change in operating environment, the processing unit (6) may be configured to generate a variation signal (V) indicative of said change in operating environment, for execution and/or activation of given actions in response to the detection of change in operating environment.

Said detection device (1) may be designed for a wearable electronic apparatus (70) for audio applications; wherein said first operating environment is an environment external to the auditory canal of a user and said second operating environment may be an environment internal to the auditory canal; said change in operating environment being indicative of introduction/extraction of said electronic apparatus (70) into/from the auditory canal.

Said processing unit (6) may be configured to execute a first comparison between said parameter of the charge-variation signal (SQ) and a first threshold (Th_hand) and, based on the result of the comparison, update the value of a state variable, indicative of the position of said detection device (1), to a first value indicative of the positioning of said detection device (1) in the hand of a user; execute a second comparison between said parameter of the charge-variation signal (SQ) and a second threshold (Th_head) and, based on the result of the second comparison within a given time interval from the first comparison, update the value of the state variable to a second value indicative of the positioning of said detection device (1) in the proximity of the user's head; and execute a third comparison between said parameter of the pressure signal (SP) and a third threshold (Th_p), and, based on the result of the comparison within a respective time interval from the second comparison, update the value of the state variable to a third value, indicative of the insertion of said detection device (1) in the auditory canal.

Said processing unit (6) may be further configured to monitor exit of said detection device (1) from the auditory canal and return of said state variable to the first value, alternatively based on the processing of the charge-variation signal (SQ), according to the result of a further comparison between the parameter of the charge-variation signal (SQ) and a further threshold (Th_head2); or based on the processing of the pressure signal (SP), according to the result of a respective further comparison between the parameter of the pressure signal (SP) and said third threshold (Th_p).

Said processing unit (6) may be configured to activate the pressure sensor (2), normally kept disabled for energy-saving purposes, only following the second comparison and updating of the value of the state variable to the second value.

The parameter of the charge-variation signal (SQ) may be the variance of said charge-variation signal (SQ); and the respective parameter of the pressure signal (SP) may be the absolute value, or gradient, of said pressure signal (SP).

After detection of insertion into the auditory canal, the processing unit (6) may be configured to generate a variation signal (V), designed to be received by a control unit of the electronic apparatus (70), in order to activate reproduction of multimedia audio files and/or transfer of data between the detection device (1) and the electronic apparatus (70).

Said detection device (1) may be designed for a wearable electronic apparatus (70) for underwater applications; wherein said first operating environment may be air and said second operating environment may be an environment in the water or underwater, said change in operating environment being indicative of entry or exit of said electronic apparatus (70) into/from the water.

Said processing unit (6) may be configured to execute a first comparison between said parameter of the charge-variation signal (SQ) and a first threshold (Th_Q); following upon the positive outcome of the first comparison, execute a second comparison between said parameter of the pressure signal (SP) and a second threshold (Th_slope); and following upon the positive outcome of the second comparison within a given time interval (T), determine entry into water of the detection device (1).

Following upon detection of entry into water, the processing unit (6) may be configured to generate a variation signal (V), designed to be received by a control unit of the electronic apparatus (70) in order to disable given energy-saving functions.

Following upon detection of entry into water, the processing unit (6) may be configured to cause variation of a full-scale value of the pressure sensor (2), switching from a first low value to a second high value, higher than the first low value, so as to enable detection of high values of pressure that may occur in the underwater environment.

The parameter of the charge-variation signal (SQ) may be the absolute value of said charge-variation signal (SQ); and the respective parameter of the pressure signal (SP) is a slope of said pressure signal (SP).

The processing unit (6) may be configured to monitor exit of the electronic apparatus (70) from the water based on processing of the pressure signal (SP) and comparison of a corresponding further parameter with a further threshold.

Said processing unit (6), said pressure sensor (2), and said electrostatic-charge-variation sensor (4) may be integrated within a same package (12, 12') provided with appropriate elements of electrical connection towards the outside environment.

Said electrostatic-charge-variation sensor (4) may include at least one detection electrode (14) designed to be arranged facing said operating environment; a high-impedance instrumentation amplifier (22) having an input coupled to said detection electrode (14); and an analog-to-digital converter (24) coupled at output of said instrumentation amplifier (22) to provide said charge-variation signal (SQ).

An electronic apparatus (70), may be summarized as including a detection device (1) and a main controller (72) coupled to the processing unit (6) of the detection device (1) in order to receive a variation signal (V), indicative of the change in operating environment, for execution and/or activation of given actions in response to detection of said change in operating environment.

The apparatus of a wearable type, may include one of the following: a wearable device for audio applications; and a wearable device for in-water or underwater applications.

A method for detecting a variation between a first operating environment and a second operating environment, different from said first operating environment, may be summarized as including receiving, from a pressure sensor (2), a pressure signal (SP) indicative of an ambient pressure in an operating environment; receiving, from an electrostatic-charge-variation sensor (4), a charge-variation signal (SQ) indicative of a variation of electrostatic charge associated with said operating environment; and jointly processing said pressure signal (SP) and said charge-variation signal (SQ) for detecting said change between a first operating environment and a second operating environment, different from said first operating environment.

The method may further include executing processing of the charge-variation signal (SQ) for a first comparison of at least one corresponding parameter with a pre-set threshold associated with said parameter; if the first comparison has a positive outcome, executing processing of the pressure signal (SP) for a second comparison of at least one respective parameter with a respective pre-set threshold associated with said respective parameter; and if the aforesaid second comparison has a positive outcome within a pre-set control time window subsequent to the aforesaid positive outcome of the first comparison, determining the occurrence of change in operating environment.

The method may include, following upon detection of said change in operating environment, generating a variation signal (V), indicative of said change in operating environment in order to execute and/or activate given actions in response to detection of change in operating environment.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A detection device, comprising:
   a pressure sensor configured to provide a pressure signal indicative of an ambient pressure in an operating environment;
   an electrostatic-charge-variation sensor configured to provide a charge-variation signal indicative of a variation of electrostatic charge associated with the operating environment; and
   processing circuitry coupled to the pressure sensor and to the electrostatic-charge-variation sensor and configured to receive the pressure signal and the charge-variation signal and to jointly process the pressure signal and the charge-variation signal and detect a variation between a first operating environment and a second operating environment for the detection device, the second operating environment being different from the first operating environment.

2. The device according to claim 1, wherein the processing circuitry is configured to:
   execute processing of the charge-variation signal for a first comparison of at least one corresponding parameter with a pre-set threshold associated with the parameter;
   if the first comparison has a positive outcome, execute processing of the pressure signal for a second comparison of at least one respective parameter with a respective pre-set threshold associated with the respective parameter; and
   if the aforesaid second comparison has a positive outcome, within a pre-set control time window subsequent to the aforesaid positive outcome of the first comparison, determine the occurrence of the change in operating environment.

3. The device according to claim 1, wherein, after detection of the change in operating environment, the processing circuitry is configured to generate a variation signal indicative of the change in operating environment, for execution or activation of given actions in response to the detection of change in operating environment.

4. The device according to claim 1, wherein the detection device is designed for a wearable electronic apparatus for audio applications; wherein the first operating environment is an environment external to the auditory canal of a user and the second operating environment is an environment internal to the auditory canal; the change in operating environment being indicative of introduction or extraction of the electronic apparatus into or from the auditory canal.

5. The device according to claim 4, wherein the processing circuitry is configured to:
   execute a first comparison between the parameter of the charge-variation signal and a first threshold and, based on the result of the comparison, update the value of a state variable, indicative of the position of the detection device, to a first value indicative of the positioning of the detection device in the hand of a user;
   execute a second comparison between the parameter of the charge-variation signal and a second threshold and, based on the result of the second comparison within a given time interval from the first comparison, update the value of the state variable to a second value indicative of the positioning of the detection device in the proximity of the user's head; and
   execute a third comparison between the parameter of the pressure signal and a third threshold, and, based on the result of the comparison within a respective time interval from the second comparison, update the value of the state variable to a third value, indicative of the insertion of the detection device in the auditory canal.

6. The device according to claim 5, wherein the processing circuitry is further configured to monitor exit of the detection device from the auditory canal and return of the state variable to the first value, alternatively:
   based on the processing of the charge-variation signal, according to the result of a further comparison between the parameter of the charge-variation signal and a further threshold; or
   based on the processing of the pressure signal, according to the result of a respective further comparison between the parameter of the pressure signal and the third threshold.

7. The device according to claim 5, wherein the processing circuitry is configured to activate the pressure sensor, normally kept disabled for energy-saving purposes, only following the second comparison and updating of the value of the state variable to the second value.

8. The device according to claim 5, wherein the parameter of the charge-variation signal is the variance of the charge-variation signal; and the respective parameter of the pressure signal is the absolute value, or gradient, of the pressure signal.

9. The device according to claim 5, wherein, after detection of insertion into the auditory canal, the processing circuitry is configured to generate a variation signal, designed to be received by a control unit of the electronic apparatus, in order to activate reproduction of multimedia audio files or transfer of data between the detection device and the electronic apparatus.

10. The device according to claim 1, wherein the detection device is designed for a wearable electronic apparatus for underwater applications; wherein the first operating environment is air and the second operating environment is an environment in the water or underwater, the change in operating environment being indicative of entry or exit of said electronic apparatus into or from the water.

11. The device according to claim 10, wherein the processing circuitry is configured to:
execute a first comparison between the parameter of the charge-variation signal and a first threshold;
following upon the positive outcome of the first comparison, execute a second comparison between the parameter of the pressure signal and a second threshold; and
following upon the positive outcome of the second comparison within a given time interval, determine entry into water of the detection device.

12. The device according to claim 11, wherein, following upon detection of entry into water, the processing circuitry is configured to generate a variation signal, designed to be received by a control unit of the electronic apparatus in order to disable given energy-saving functions.

13. The device according to claim 11, wherein, following upon detection of entry into water, the processing circuitry is configured to cause variation of a full-scale value of the pressure sensor, switching from a first low value to a second high value, higher than the first low value, so as to enable detection of high values of pressure that may occur in the underwater environment.

14. The device according to claim 11, wherein the parameter of the charge-variation signal is the absolute value of the charge-variation signal; and the respective parameter of the pressure signal is a slope of the pressure signal.

15. The device according to claim 11, wherein the processing circuitry is configured to monitor exit of the electronic apparatus from the water based on processing of the pressure signal and comparison of a corresponding further parameter with a further threshold.

16. The device according to claim 1, wherein the processing circuitry, the pressure sensor, and the electrostatic-charge-variation sensor are integrated within a same package having electrical connection elements configured to electrically connect with one or more external devices.

17. The device according to claim 1, wherein the electrostatic-charge-variation sensor includes at least one detection electrode designed to be arranged facing said operating environment; a high-impedance instrumentation amplifier having an input coupled to the detection electrode; and an analog-to-digital converter coupled at output of said instrumentation amplifier to provide the charge-variation signal.

18. An electronic apparatus, comprising:
a detection device, including:
a pressure sensor configured to provide a pressure signal indicative of an ambient pressure in an operating environment;
an electrostatic-charge-variation sensor configured to provide a charge-variation signal indicative of a variation of electrostatic charge associated with said operating environment; and
processing circuitry coupled to the pressure sensor and to the electrostatic-charge-variation sensor and configured to receive the pressure signal and the charge-variation signal and to jointly process the pressure signal and the charge-variation signal and detect a variation between a first operating environment and a second operating environment for the detection device, the second operating environment being different from the first operating environment; and
a main controller coupled to the processing circuitry of the detection device and configured to receive a variation signal, indicative of the change in operating environment, for execution or activation of given actions in response to detection of the change in operating environment.

19. The apparatus according to claim 18, of a wearable type, further comprising at least one of the following: a wearable device for audio applications, or a wearable device for in-water or underwater applications.

20. A method for detecting a variation between a first operating environment and a second operating environment, different from the first operating environment, comprising:
receiving, from a pressure sensor, a pressure signal indicative of an ambient pressure in an operating environment;
receiving, from an electrostatic-charge-variation sensor, a charge-variation signal indicative of a variation of electrostatic charge associated with the operating environment; and
jointly processing the pressure signal and the charge-variation signal and detecting the change between the first operating environment and the second operating environment, different from the first operating environment.

21. The method according to claim 20, further comprising:
executing processing of the charge-variation signal for a first comparison of at least one corresponding parameter with a pre-set threshold associated with the parameter;
if the first comparison has a positive outcome, executing processing of the pressure signal for a second comparison of at least one respective parameter with a respective pre-set threshold associated with the respective parameter; and
if the aforesaid second comparison has a positive outcome within a pre-set control time window subsequent to the aforesaid positive outcome of the first comparison, determining the occurrence of change in operating environment.

22. The method according to claim 20, comprising, following upon detection of the change in operating environment, generating a variation signal, indicative of the change in operating environment in order to execute or activate given actions in response to detection of change in operating environment.

\* \* \* \* \*